United States Patent [19]

Lewis

[11] 3,950,713
[45] Apr. 13, 1976

[54] ACOUSTIC WAVE DEVICES
[75] Inventor: Meirion Francis Lewis, Malvern, England
[73] Assignee: National Research Development Corporation, London, England
[22] Filed: Feb. 14, 1974
[21] Appl. No.: 442,624

[30] Foreign Application Priority Data
Feb. 16, 1973  United Kingdom............... 7880/73

[52] U.S. Cl................. 333/30 R; 310/8.1; 310/9.8; 331/107 A; 333/72
[51] Int. Cl.².. H03H 9/26; H03H 9/30; H03H 9/32; H03B 5/30
[58] Field of Search ......... 333/30 R, 72; 310/8, 8.1, 310/8.2, 9.7, 9.8; 331/107 A, 108 B, 135, 117 D

[56] References Cited
UNITED STATES PATENTS
3,766,496  10/1973  Whitehouse .................... 331/107 A
3,805,189  4/1974  Zucker et al. .................. 331/107 A Primary Examiner—Eli Lieberman
Assistant Examiner—Marvin Nussbaum
Attorney, Agent, or Firm—Cushman, Darby & Cushman

[57] ABSTRACT

A surface acoustic wave delay line for use with an amplifier to form an oscillator has the spacing of its two transducers arranged to provide the desired mode of oscillation and the frequency responses of one or both transducers arranged to suppress unwanted modes of oscillation. Various transducers configuration are provided to reduce reflection problems between and within the transducers. The oscillator may be frequency modulated.

8 Claims, 13 Drawing Figures

ACOUSTIC WAVE DEVICES

This invention relates to acoustic wave devices for mode selection in oscillators. These devices may propagate surface acoustic waves (SAW) or bulk acoustic waves (BAW).

It is well known that high Q quartz crystals can be used to stabilise oscillator circuits. In these crystals a voltage is applied between two faces of the crystal spaced one half wavelength apart. Such a construction provides resonant bulk acoustic waves within the crystal.

Quartz crystals have also been used in surface acoustic wave devices where signals fed into an input transducer at one end of a crystal generates surface acoustic waves which are detected by an output transducer at the other end of the crystal. Frequently the transducers are interdigital transducers. Such a device is useful as a delay line.

Surface acoustic wave oscillators have been made using identical input and output interdigital comb transducers mounted on lithium niobate. The two transducers are connected to the input and output of a suitable amplifier to provide an oscillator operating in one of a number of possible modes or frequencies. One problem with such an oscillator is mode selection, i.e., operation at the desired frequency with suppression of other non-wanted modes.

An object of this invention is to provide mode selection in an acoustic wave oscillator.

According to this invention an acoustic wave device for use with an amplifier to form an oscillator includes a substrate able to support acoustic waves and an input and an output transducers mounted on a surface of the substrate for respectively launching and receiving acoustic waves in the substrate between the transducers, the spacing of the transducers determining the modes of oscillation and the individual or combined frequency responses of the transducers arranged to suppress unwanted modes.

In one form of this invention the transducers are arranged so that the effective length of the one transducer is equal to the distance between the centres of both transducers.

Preferably the transducers are of unequal length, but may be of approximately equal length provided one or both transducers are slightly shortened to avoid contact between the two transducers.

In another form of the invention the combined frequency response of both transducers is arranged to suppress unwanted modes by using unequal length transducers with one transducer formed by groups of finger pairs and the separation between transducers equal to the sum of their effective lengths.

The device according to this invention may use surface acoustic waves or bulk acoustic waves propagating between the two transducers below the surface on which the transducers are mounted. When operating with bulk acoustic waves the surface between transducers may carry damping material to prevent surface acoustic waves between the transducers.

Preferably the substrate is single crystal quartz and the transducers are interdigital comb transducers. The substrate may be of piezo electric material (e.g. lithium niobate) or other material able to support surface acoustic waves with a layer of piezo electric material between or above the substrate and transducers.

The invention will now be described by way of example only in the accompanying drawings in which.

Figure 1:
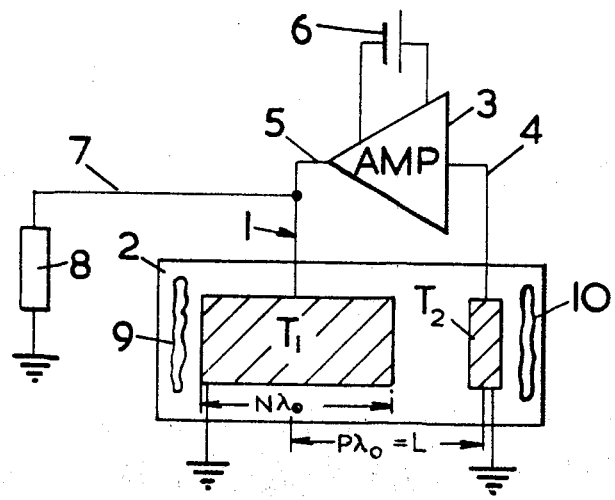
FIG. 1 is a circuit diagram of a surface acoustic wave oscillator.

As seen in FIG. 1 the oscillator 1 comprises a single crystal ST cut quartz substrate 2 with an input interdigital comb transducer $T_1$ and an output interdigital comb transducer $T_2$. An amplifier 3 has its input 4 and output 5 connected to the output and input transducers $T_2$ and $T_1$. Electrical energy is supplied to the amplifier 3 from a battery 6, and electrical output is tapped at 7 to supply a load 8. Strips 9, 10 of a damping material are placed at the ends of the substrate 2 to absorb any surface acoustic waves that pass beyond the transducers $T_1$, $T_2$. Alternatively the substrate 2 ends may be angled to de-phase reflected SAW as seen by the transducers. The surface acoustic wave device formed by the substrate and transducers $T_1$, $T_2$ is a surface acoustic wave delay line.

The frequency of modes of oscillation which can be excited is shown by the equation:

$$2\pi n = \frac{\omega L}{c} + \phi_T + \phi_{amp} \qquad (1)$$

where
$n$ is an integer
$\omega$ is an oscillation frequency
L is path length
c is the surface (or bulk when appropriate) acoustic wave velocity and $\phi_T$, $\phi_{amp}$ are the electrical phase shifts in the transducers and amplifier respectively.

If 'L' is made large, $\phi_T + \phi_{amp}$ can be ignored relative to $\omega L/c$ then $$\omega = \frac{2\pi c}{L} n \qquad (2)$$

Figure 3:
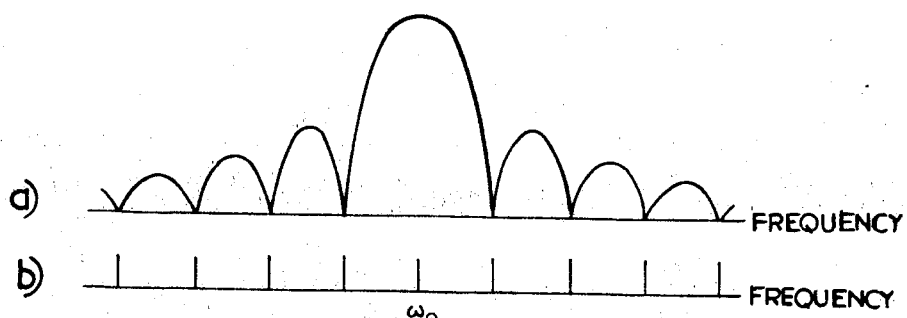
FIG. 3 is a frequency response (acoustic radiation resistance) diagram for the longer transducer in the oscillator shown in FIG. 1.

Thus the allowed modes form a comb of frequencies shown in FIG. 3b.

The separation of these frequencies of possible oscillation is $$\delta\omega = \frac{2\pi c}{L} \quad (3)$$

The frequency response of a transducer $T_1$ can be shown to be of the form $(\sin x/x)^2$ where $x = N\pi(\omega-\omega_o)/\omega_o$ N being the number of finger pairs in the transducer, $\omega$ the frequency, and $\omega_o$ the centre frequency.

The transducer has a zero response when sinX is zero i.e., when $x = N\pi(\omega-\omega_o)/\omega_o = \pm R\pi$ where R is an integer except zero. Therefore the frequency separation of the zero response $$\Delta\omega = \frac{\omega_o}{N} \quad (4)$$

For an oscillator to operate at the centre frequency $\omega_o$ all modes except the centre frequency are arranged to coincide with a zero of the transducer response.

Thus for good mode selection $$\delta\omega = \Delta\omega$$

from (1) and (2)

$$\frac{2\pi c}{L} = \frac{\omega_o}{N}$$

since $c = f_o\lambda_o$ where $f_o$ = centre frequency in cycles/second $\lambda_o$ = wavelength at centre frequency and $$\omega_o = 2\pi f_o$$

$$L = N\lambda$$

Figure 2:
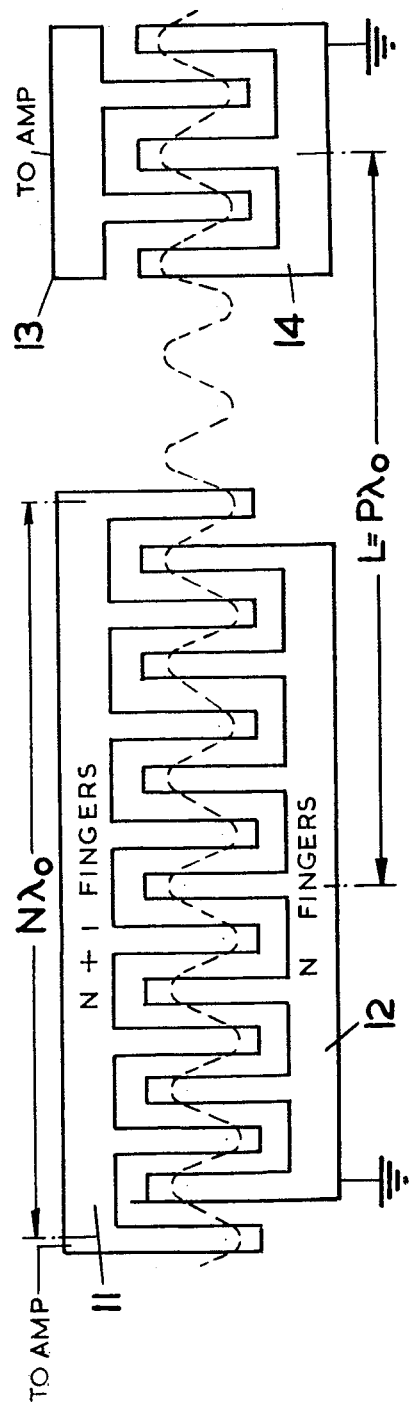
FIG. 2 is a view of a surface acoustic wave device to be used in FIG. 1 and shows diagrammatically the construction of an interdigital comb transducer.

Therefore, for strong mode selection, the path length L between transducers $T_1$ and $T_2$ is made equal to the effective length of transducer $T_1$ i.e., $N\lambda$, as shown in FIG. 2. FIG. 3a shows such a strong mode selection with the centre frequency favoured and all other modes strongly suppressed. As shown in FIG. 2 the transducer $T_1$ comprises several conductors or fingers arranged in a comb shape, one comb 11 being connected to the amplifier output 5 and the other comb 12 earthed. Similarly output transducer T2 has two combs 13, 14 respectively connected to amplifier input 4 and earth. In this context a finger pair comprises one period (wavelength) of the pattern.

When electrical energy is supplied to the amplifier 3 noise in the amplifier 3 will be fed into the transducer $T_1$.

However because of the strong suppression of modes other than $\omega_o$ the oscillator will after a short time oscillate at the centre frequency $\omega_o$ as required.

Increasing the length of $T_1$ (e.g. by increasing the number of finger pairs) and the path length L gives the oscillator greater insensitivity to the electrical circuit. However increasing the number of finger pairs in a transducer can cause problems due to reflections between finger pairs. Present theory indicates that reflection problems start when about 100 finger pairs are used, and become very severe at about 1,000 finger pairs.

To provide an effectively long transducer without multiple reflection problems a long transducer can be made by missing out numerous finger pairs.

Figure 5:
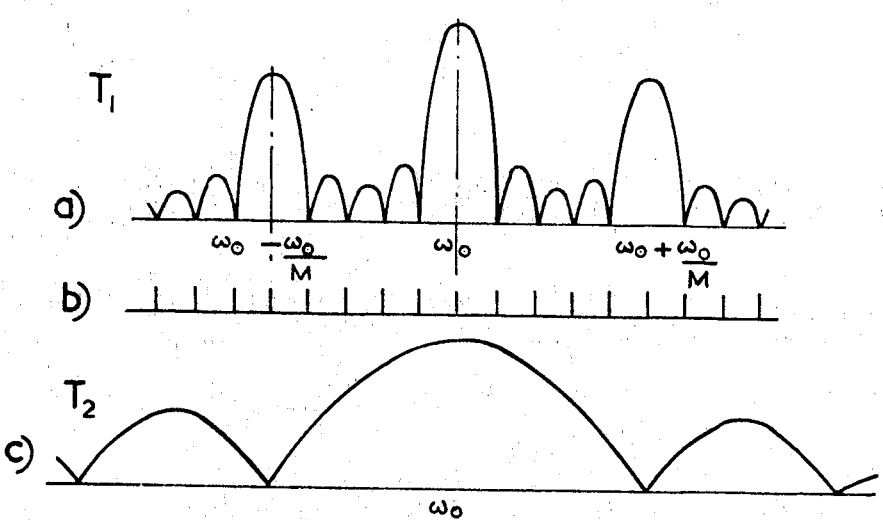
FIG. 5 is a frequency response diagram for the transducers shown in FIG. 4.
Figure 4:
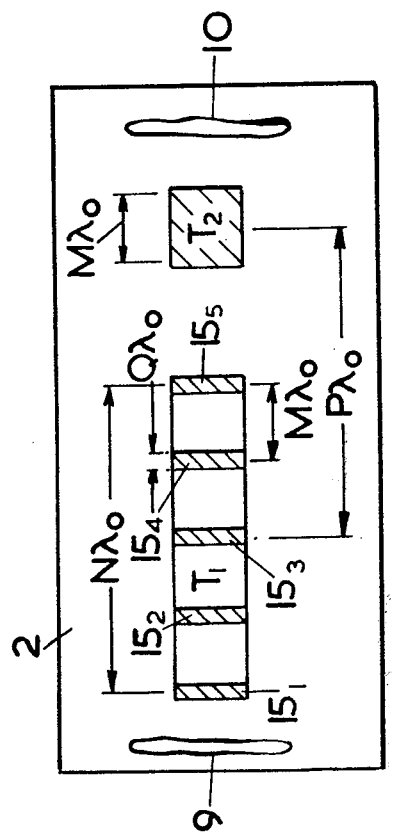
FIG. 4 is a diagrammatic view of a modified form of surface acoustic wave device.

FIG. 4 shows an interdigital comb transducer $T_1$ of effective length $N\lambda_o$ having five groups 15 of finger pairs each group having 20 finger pairs separated by a gap equal to 80 wavelenths. Such a transducer $T_1$ will have a frequency response as shown in FIG. 5a and it is seen that there are large side bands two of which are shown. Mode frequencies are indicated in FIG. 5b. If transducer $T_2$ has 100 finger pairs i.e., its length equals the distance $M\lambda$, between the centres of groups of finger pairs in $T_1$ then it will have a frequency response shown at FIG. 5c. The path length is $(N + M)\lambda$. The resultant frequency response of the oscillator will show strong suppression of all modes bar the centre frequency $\omega_o$ since the large sideband response of $T_1$ coincides with a zero response of $T_2$.

The following calculations show how the transducer dimensions and path length are arrived at.

Assume for transducer $T_1$,$N\lambda_o$ is effective length, the five groups of finger pairs $15_{1-5}$ have $Q\lambda_o$ finger pairs, the spacing of the groups $15_{1-5}$ is $M\lambda_o$. The effective length of transducer $T_2$ is $M\lambda_o$. Path length (between centres of $T_1$ and $T_2$) is $P\lambda_o$.

Calculations may be made in time or frequency domains — in this case it is easier to visualise in the time domain. If the transducer $T_2$ is impulsed a burst of SAW of centre frequency $\omega_o$, SAW of length $M\lambda_o$ travel towards the transducer $T_1$ the output of which is an extended burst of frequency $\omega_o$ of duration approximately $M\omega + N\lambda$. Fourier transforming this the frequency response is obtained which is of the $(\sin x/x)$ type with its first zeroes at $\omega = \omega_o(1 \pm 1/(M + N))$. To make these zeroes correspond with the unwanted modes of the complete oscillation the path length $P\lambda = (M + N)\lambda$. By doing a full calculation in the frequency domain it can be shown that this condition is unaffected by the number of finger pairs, Q, in each batch. Although this defeats the objective, if one made Q = M, one would have a solid transducer of total length $(N + M)\lambda$ and mode selection would arise as described with reference to FIGS. 1, 2.

It is also possible to calculate the response in the frequency domain.

Assume that each group $15_{1-5}$ contains a single source; thus $T_1$ contains M + N/M sources (in FIG. 4 — five sources) with a fundamental frequency $\omega_o/M$.

This will have the typical sin $x/x$ type of response central about $\omega_o/M$ with zero responses at $$\frac{\omega_o}{M}\left(1 + \frac{M}{M+N}\right), \left(\frac{\omega_o}{M} \ 1 + \frac{2M}{M+N}\right) \text{ etc.}$$

The sin $x/X$ response is repeated at harmonics of this i.e., at $2\omega_o/M$, $3\omega_o/M$ etc., until the centre frequency of the sin $x/x$ response will be $\omega_o$ as shown in FIG. 5a. Harmonics will also occur at $\omega_o - \omega_o/M$ and $\omega_o + \omega_o/M$ which produce the large responses either side of $\omega_o$ as shown.

For the modes of oscillation FIG. 5b to coincide with the zero's of responses the frequency separation of modes must equal the frequency separation of the zero responses i.e. $\dfrac{2\pi c}{P\lambda_o} = \dfrac{\omega_o}{M+N}$ i.e. $P = M + N$.

The frequency response of $T_2$ has a response as shown in FIG. 5c with zeros at $\omega_o(1 \pm 1/M)$ which interacts with the frequencies $\omega_o(1 \pm 1/M)$ at $T_1$ to give a net zero response for the combination of $T_1$ and $T_2$.

Note the oscillator also has relatively slowly varying reponses for the groups $15_{1-5}$ and the individual fingers which should multiply the responses shown. However these cannot remove the zeros already present to suppress unwanted modes. Thus the response is independent of Q the number of finger pairs in each group $15_{1-15}$.

Figure 6:
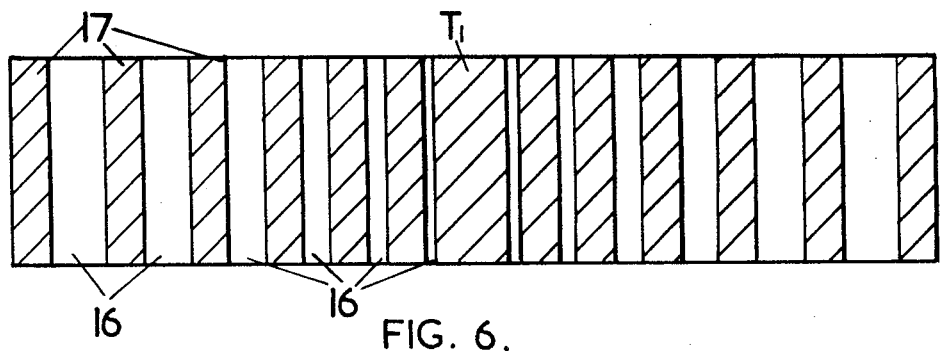
FIG. 6 is a diagrammatic view of another modified transducer.
Figure 7:
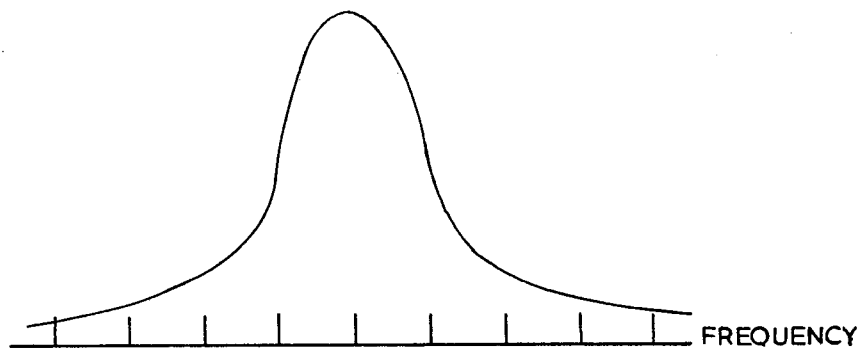
FIG. 7 shows the frequency response of the transducer shown in FIG. 6.

FIG. 6 shows another modified transducer $T_1$ with numerous finger pairs missing (indicated at 16) in order to keep the total number of finger pairs 17 low enough to suppress unwanted reflections. This transducer $T_1$ is symmetric about its centre and has groups of finger pairs missing, each group having gradually increasing numbers of missing fingers away from the centre of $T_1$. A satisfactory arrangement is for the number of active fingers to vary in the familiar Gaussian distribution about the centre. The frequency response of $T_1$ is shown in FIG. 7 where it is seen that modes other than $\omega_o$ are suppressed though not so strongly as in the previous construction.

The transducer shown in FIG. 6 has the number of finger pairs missing gradually increasing away from the transducer centre. An alternative construction has the number of finger pairs missing randomly distributed along the transducer but still retaining symmetry about its centre.

Figure 8:
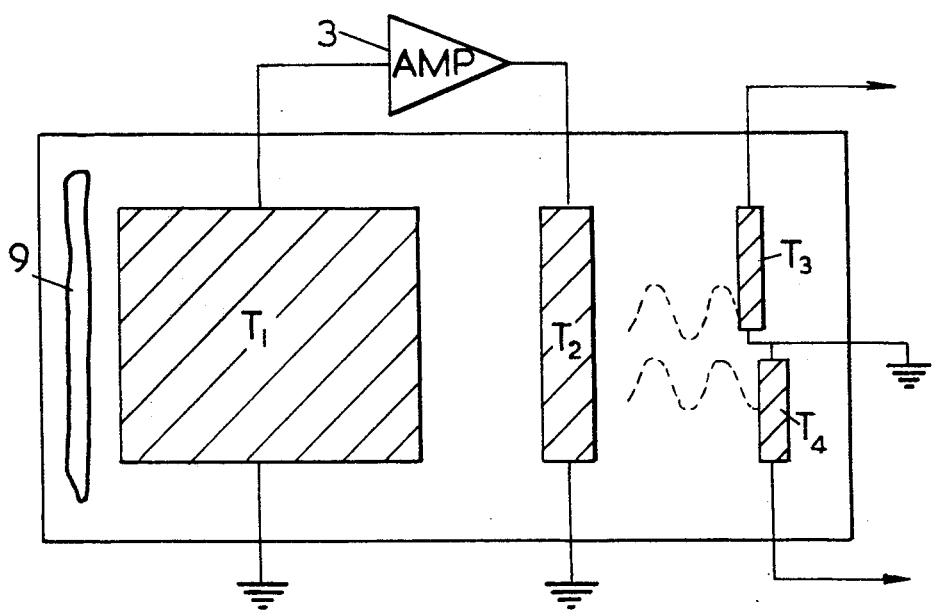
FIG. 8 is an alternative circuit diagram for a surface acoustic wave oscillator with surface acoustic wave output taps.

FIG. 8 shows diagrammatically how the oscillator output may be tapped without any connection to the electrical connections of the oscillator. Two output interdigital transducers $T_3$ and $T_4$ are placed between the oscillator input transducer $T_2$ and the nearby end of the substrate 2. Both transducers $T_3$ and $T_4$ are in the path of surface acoustic waves excited by transducer $T_2$ and are spaced along this path ¼ wavelength apart. Thus $T_3$ and $T_4$ have outputs 90° different in phase. This could be useful in single sideband transmission and in phase sensitive detectors. Similarly multiphase outputs can be employed to generate phase-shift keyed (P.S.K.) signals.

If a stable frequency of oscillation is required the substrate should have, ideally, zero temperature coefficients. Such a substrate may be of ST cut quartz crystal which has high temperature stability or various other cuts of quartz. However an oscillator may be made using other piezo electric substrates and using the variation of frequency with temperature to measure temperature.

The substrate 2 is preferably a piezoelectric material but can be other materials capable of supporting surface acoustic waves. In such a case piezo electric materials must be deposited on the substrate between it and the transducer or on the transducer.

An advantage with surface acoustic wave oscillators is that the crystal substrate can be made large enough to be very robust. As an example a complete oscillator (FIG. 1) i.e., surface acoustic wave delay line plus amplifier and associated wiring has been built on an inch square board. Typically $T_1$ may have 100 finger pairs with a separation of 8 microns between fingers, and an effective length of 3200 microns. Transducer $T_2$ may have 60 finger pairs with identical finger separation. With a quartz substrate such a device would have a centre frequency of oscillation of about 100 MHz.

If very small size oscillators are required these may be fabricated with both surface acoustic wave delay line and amplifier on one substrate using conventional integrated circuit fabrication technique.

In some cases it may be desirable to incorporate a limiter into the oscillator circuit, connected between the amplifier output and the delay line. This will limit the level of oscillation without saturating the amplifier, and may be useful to eliminate the phase shift changes in saturated amplifiers.

The oscillator of this invention may be used to provide a frequency modulated source. This may be achieved by using a phase shift network in the amplifier circuit. Typically a phase shift of $\pm\pi/2$ can be introduced and this will cause a fractional frequency shift of $\mp\lambda/4L$ where $\lambda$ is the wavelength and L the path length. The path length L can be chosen to give the required amount of modulation which may be greater than that achieved with conventional quartz crystal oscillators.

The oscillator of this invention may also be used as a narrow band active filter in which case the amplifier gain is set just below oscillation.

Figure 9:
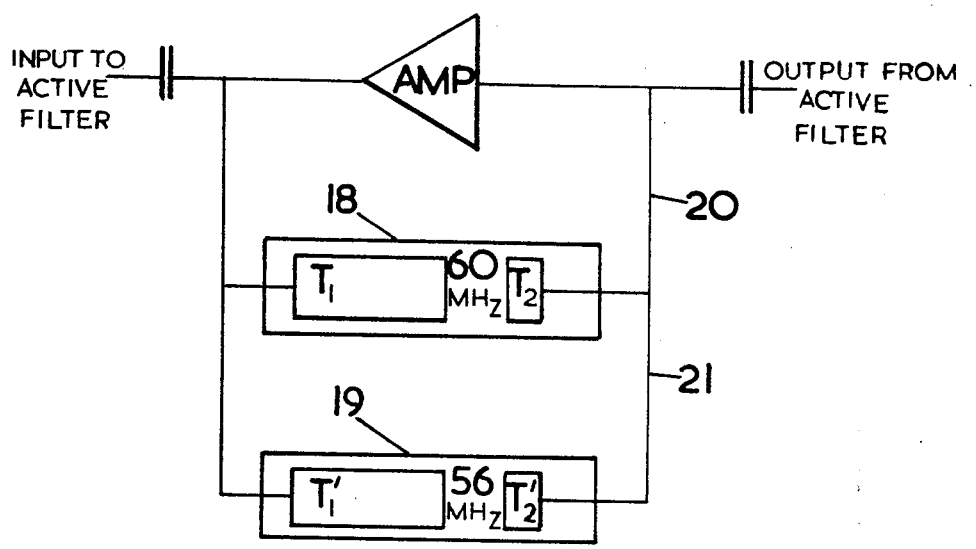
FIG. 9 is a circuit diagram for an active filter using an oscillator of this invention.

One example of an active filter is shown in FIG. 9 to comprise two delay lines 18 and 19 connected in parallel with an amplifier 3. The delay lines 18 and 19 have centre frequencies of 60 MHz and 56 MHz respectively.

Thus there are two loops 20, 21 and the arrangement can oscillate in one or other loop, at 60MHz or 56MHz. The circuit is arranged so that the amplifier gain can be set to maintain one loop in oscillation whilst the other loop is below oscillation threshold. The oscillating loop provides circuit stability against temperature or supply voltage drift, etc. whilst the non-oscillation loop acts as an active filter.

As noted previously increasing the number of finger pairs in a transducer causes problems of reflection and the transducer $T_1$ of FIG. 4 is one way of avoiding some of the problems. However the transducer $T_2$ of FIG. 4 may have its own undesirable intra transducer reflection.

Reflection problems are most troublesome at high frequencies with their corresponding small acoustic wavelengths. The thickness of transducers working at these frequencies is not negligible compared with the wavelength and this produces reflections which cannot be balanced electrically. One solution to this difficulty is to use "split finger" transducers as described by T. W. Bristol in Proceedings of the International Specialist Seminar on Component Performance and Systems Applications of Surface Acoustic Devices (1973) pages 115–129. However this requires higher photolithographic resolution and at very high frequencies an alternative technique must be used.

Figure 10:
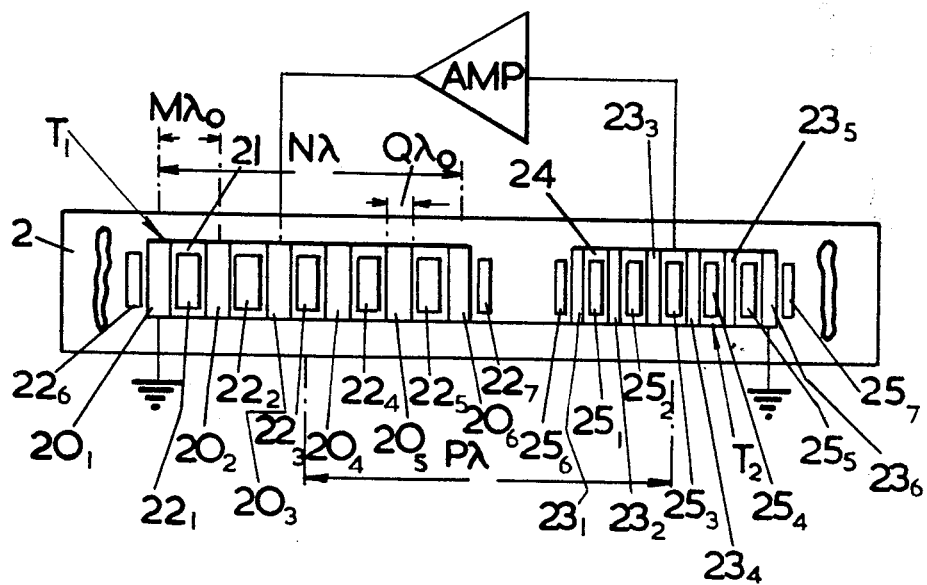
FIG. 10 is a diagrammatic view of another form of oscillator.

FIG. 10 shows an input and an output transducer $T_1$, $T_2$ respectively both incorporating quarter wave reflectors mounted on a quartz substrate.

Figure 11:
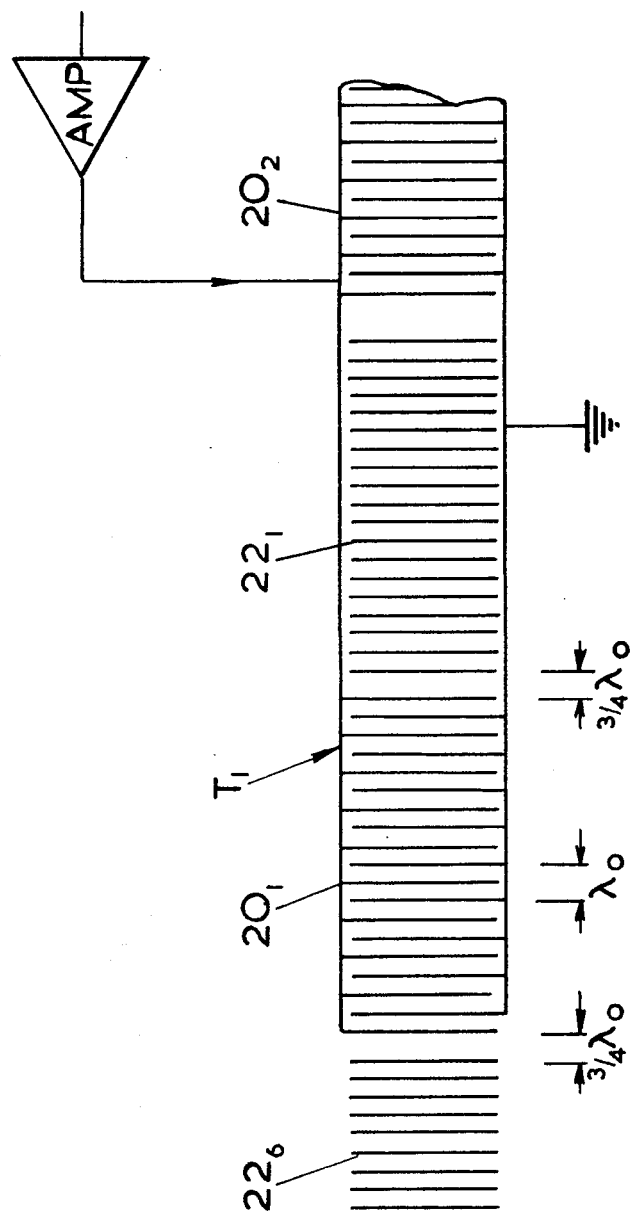
FIG. 11 is an enlarged view of part of FIG. 10.

FIG. 11 is an enlarged view of part of the transducer; each line representing a conducting strip of material (e.g. aluminium) typically $1\mu$ wide and $0.5\mu$ thick for 800 MHz.

As shown transducer $T_1$ is an interdigital comb transducer of end to end length $104\lambda_0$ arranged with finger pairs in six groups $20_{1-6}$ of nine finger Pairs (i.e., 19 separate fingers) separated by gaps 21 equal in width to 10 wavelengths. Within each gap 21 are nineteen separate straight conductors $22_{1-5}$ of similar dimension to the fingers of the transducer but electrically isolated from one another or alternatively connected to one side (usually the earth side) of the transducer $T_1$. These conductors form quarter wave reflectors 22 and are equally spaced from one another but spaced an odd multiple of quarter wave length from the transducer fingers. Also quarter wave reflectors $22_6$, $22_7$ are arranged ten at one end and nine at the other end of $T_1$. The total number of fingers in $T_1$ is equalled by the number of quarter wave reflectors. Likewise transducer $T_2$ is an interdigital comb transducer of length $71\lambda_0$ arranged with finger pairs in six groups $23_{1-6}$ of six finger pairs (i.e., 13 separate fingers) with five spaces 24 of length equal to seven wavelengths. In these spaces 24 are five groups $25_{1-5}$ of 13 quarter wave reflectors. Also, seven and six quarter wave reflectors $25_{6,7}$ are arranged at the ends of $T_2$ so that the total number of quarter wave reflectors equals the total number of separate fingers in $T_2$.

Figure 12:
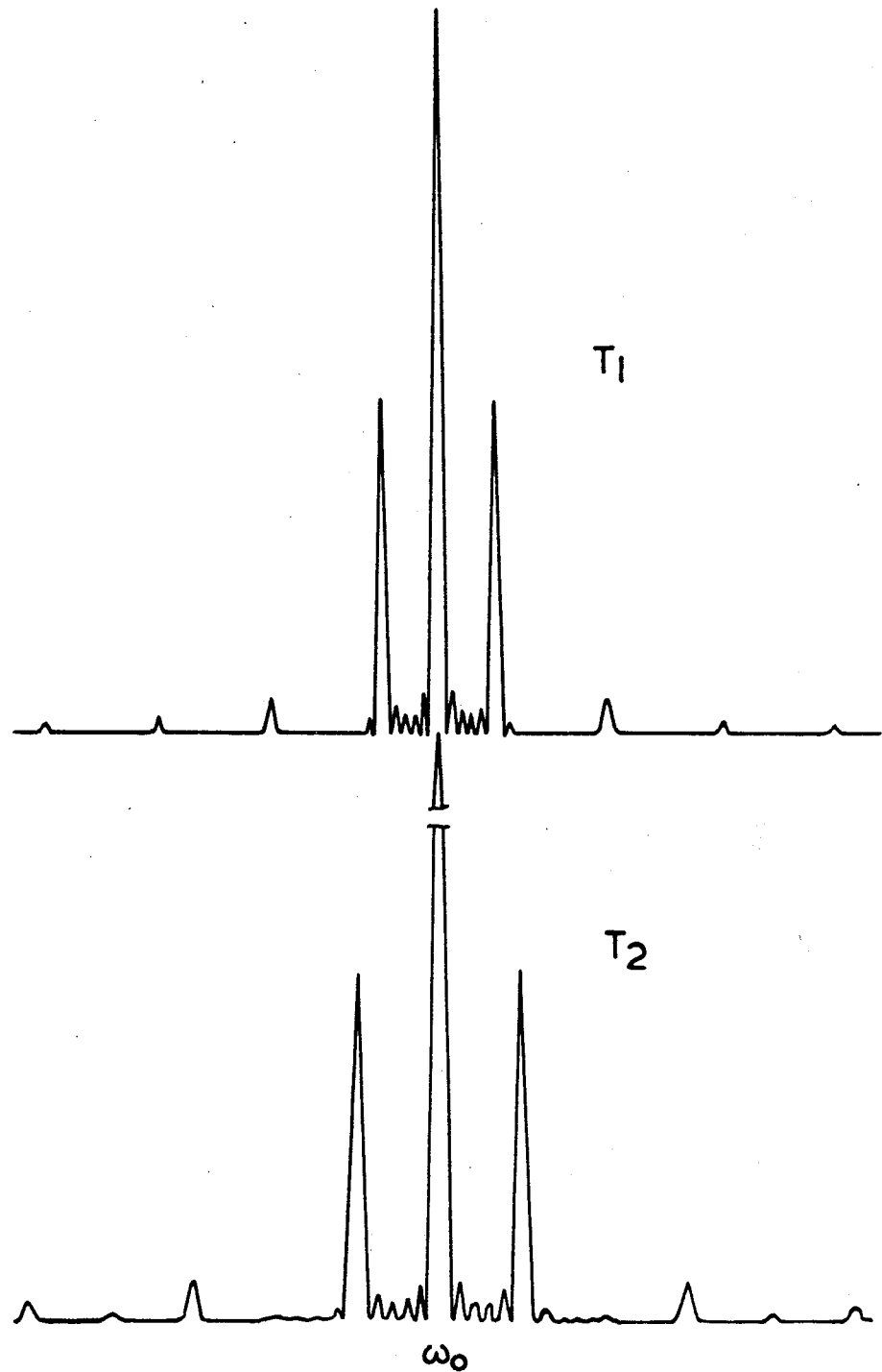
FIG. 12 is a response diagram for the arrangement of FIGS. 10, 11.

The responses of transducers $T_1$ and $T_2$ are shown in FIGS. 12 a and b respectively and it is seen that for all frequencies other than $\omega_0$, the centre frequency, the combined output is zero, i.e., large side lobes in one transducer coincide with a zero on the other transducer.

The operation of the quarter wave reflectors is as follows, and is analogous to the operation of a "bloomed" lense in optics. Consider the group of finger pairs $20_1$ in $T_1$, FIG. 11, surface acoustic waves generated by the group travel towards the quarter wave reflectors $22_1$. Some of the waves pass through the quarter wave reflectors $22_1$ to the next group of finger pairs $20_2$ whilst some of the wave energy is reflected from the reflectors $22_1$ back to the group $20_1$ of finger pairs. Also some of the waves pass through, and add to the waves from, group $20_2$ and some reflect back from group $20_2$. Such reflected waves will be 180° out of phase with waves reflected/generated back from the other groups of finger pairs in $T_1$ and transducer $T_2$. Thus over the whole of the two transducers $T_1$, $T_2$ reflected waves tend to cancel one another.

As an example of the effect of quarter wave reflectors an oscillator having the configuration of FIGS. 10, 11 has been built and operated at 200 MHz. It showed none of the strong inter and intra transducer reflections found on 200 MHz oscillators built as shown in FIG. 1 with $T_1$ having 100 finger pairs, $T_2$ having 70 finger pairs, a path length of $100\lambda_0$, and $h/\lambda_c \geq 10^{-3}$ where $h$ is transducer thickness.

The useful effect of the quarter wave reflector is limited to a narrow frequency band but this is no disadvantage for an oscillator even when used as a frequency modulated source.

The mode selection shown in FIG. 12 is easily achieved. Firstly let the longer transducer $T_1$ comprise $S_1$ groups of $Q_1$ finger pairs with centre-to-centre spacing $M_1$ approximately equal to $2Q_1$. Then, as in the case of FIG. 4, mode selection will require a path length $P\lambda = SM_1$. Since the unwanted sidebands of $T_1$ occur at frequencies $\omega_0 \pm R\omega_0/M_1$, where R is an integer, and since each batch contains about $M_1/2$ fingers the first zero of the batch responses occurs at $\omega_0 \pm 2\omega_0/M_1$.

Thus the main spurious response is at $\omega_0 \pm \omega_0/M_1$; all other spurious responses are small and the even order ones vanish. Similarly the only serious spurious response of transducer $T_2$ is at frequency $\omega_0 \pm \omega_0/M_2$. It is simple to choose $M_1$ and $M_2$ so that overlap of these spurious responses does not occur. For example if we make $M_1:M_2$ approximately equal to the ratio of two small integers (2:1, 3:2, 4:3) overlap does not occur.

This ratio should not approach $(S_1 + 1):S_1$ or overlap will start to occur; for example in the described FIGS. 11 and 12, one should not make $M_1:M_2$ 7:6. For FIGS. 10, 11 $M_1:M_2 = 19:13$ which is very close to 3:2 and no overlap occurred, see FIG. 12.

The geometry of FIGS. 10, 11 may be modified by reducing the number of finger pairs in each group and reducing the number of reflectors in each gap to form two open-structure transducers (similar to FIG. 4). The advantages of this are as described above, i.e., (1) the number of fingers per transducer is kept down but the pathlength is kept up (2) the propagation is largely on unmetalised quartz which reduces reflections (and attenuation at higher frequencies) and makes the frequencies more reproducible.

Figure 13:
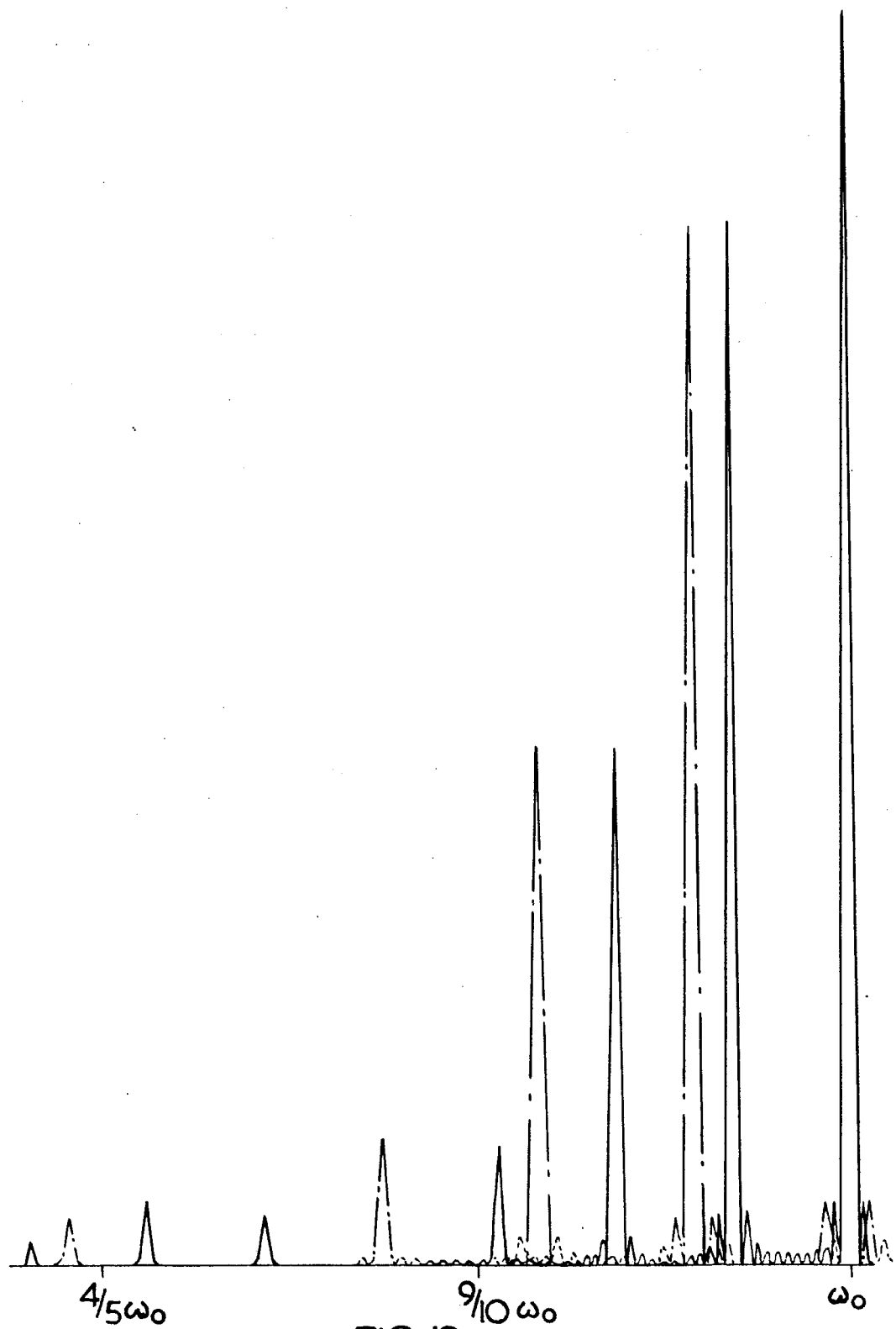
FIG. 13 is a response diagram for another form of oscillator.

FIG. 13 shows the response of an oscillator in which $S_1 = S_2 = 12$; $M_1 = 32$; $M_2 = 24$; $Q_1 = 8$; $Q_2 = 6$. Only one half of the response is shown but it is symmetric about $\omega_0$.

(Note: it is desirable to make the fraction of quartz metallised the same in both transducers $T_1$, $T_2$, i.e., to make $Q_1:M_1 = Q_2:M_2$.)

However, the bandwidth of each group is now increased and the problem of overlapping or coincidence of spurious responses from the two open-structure transducers becomes greater. One solution to this problem is again to make the ratio $M_1:M_2$ equal to the ratio of two smallish integers say 4:3. In these circumstances the fourth spurious response of transducer $T_1$ overlaps the third spurious response of transducer $T_2$. However if this overlap also coincides with the first zero of the $(\sin x/x)$ response of a group of the transducer $T_1$, the problem is solved since the net response of $T_1$ at this frequency is zero. In the example of FIG. 13 this condition will obtain when $Q_1 = M_1/4$ since the first zeros of this group occur at $\omega_0 \pm 4\omega_0/M_1$. Of course, care must be taken in the choice of the number of batches ($S_1$ and $S_2$) that the individual spurious responses are sufficiently narrow that, for example, the first spurious transducer $T_1$ does not overlap the first spurious transducer $T_2$. As shown the full width (between zeroes) of the first spurious response of each group of transducer $T_1$ is $2\omega_0/S_1M_1$, while that of transducer $T_2$ is $2\omega_0/S_2M_2$. Therefore to avoid overlap they must be separated by $\omega_0/S_1M_1 + \omega_0/S_2M_2$. But the first spurious response of transducer $T_1$ is at $\omega_0 \pm \omega_0/M_1$ and that of $T_2$ at $\omega_0 \pm \omega_0/M_2$ so the separation $$\frac{\omega_0}{M_2} - \frac{\omega_0}{M_1} = \omega_0 \left(\frac{1}{M_2} - \frac{1}{M_1}\right)$$

therefore we must have $$\omega_0 \left(\frac{M_1 - M_2}{M_1 M_2}\right) > \omega_0 \left(\frac{1}{S_1 M_1} + \frac{1}{S_2 M_2}\right)$$

i.e., $$(M_1 - M_2) > \frac{S_1 M_1 + S_2 M_2}{S_1 S_2}.$$

For the transducers of FIG. 13 this equation becomes:

$$M_1 - M_2 = 8$$

$$\frac{S_1 M_1 + S_2 M_2}{S_1 S_2} = 4\tfrac{2}{3}$$

i.e., $8 > 4\tfrac{2}{3}$ so the condition above was well satisfied and no overlap occurred.

All the constructions noted above have been directed to surface acoustic wave devices. Surface wave transducers can also generate bulk acoustic waves (BAW) which may travel just below the surface between two surface wave transducers. The bulk waves may be used instead of the surface waves described above in which case a layer or piece of absorbent material is placed on the surface between two transducers. This damps out surface acoustic waves. Alternatively the transducers may be tuned inductively to the bulk acoustic wave frequency. Delay lines using this bulk wave transmission may then be used to provide oscillators and active filters as described above with reference to surface acoustic waves.

When employing bulk acoustic waves, an improvement in the temperature stability of the oscillator can be made by choosing one of a family of cuts of quartz which support the same bulk wave as is used in the conventional AT-cut bulk wave oscillator. This wave is a slow shear wave propagating along the AT-axis and polarised in the X-direction. Thus an oscillator may be constructed using a slice of quartz oriented at right angles to the AT-plane and to the YZ-plane. Another desirable family of cuts of quartz to employ in the bulk wave oscillator are those on which the bulk and surface wave velocity surfaces merge (or very nearly merge) i.e., those in which the bulk wave almost or exactly satisfies the traction-free boundary conditions at the surface. This eliminates the problem of interference between the bulk and surface acoustic waves. It so happens that this condition is also satisfied by the aforementioned plane which is perpendicular to the AT-plane and YZ-plane, so this is a particularly attractive orientation of quartz to use for the bulk wave oscillator.

I claim:

1. An acoustic wave device comprising: a substrate able to support acoustic waves; an interdigital comb input transducer for launching acoustic waves in the substrate; an interdigital comb output transducer for detecting and receiving acoustic waves launched by the input transducer; wherein one of the transducers is of greater effective length than the other transducer, and wherein the length of the longer transducer is related to the separation of the transducers so as to produce frequency responses which suppress unwanted modes of acoustic frequency oscillation and allow only one mode.

2. A device according to claim 1 wherein the path length between the centres of the two transducers is equal to the effective length of the longer transducer.

3. A device according to claim 1 wherein at least the longer transducer has finger pairs arranged in groups with spaces between groups.

4. A device according to claim 3 wherein the groups of finger pairs in at least the longer transducer are equi-spaced from one another.

5. A device according to claim 4 wherein the pathlength between the centres of both transducers equals the sume of the effective length of the longer transducer and the length between centres of groups of adjacent finger pairs in the said longer transducer.

6. A device according to claim 5 wherein the shorter transducer has a single group of finger pairs of effective length equal to the length between centres of groups of finger pairs in the longer transducer.

7. A device according to claim 1 wherein at least the longer transducer has finger pairs arranged in groups equi-spaced apart with quarter wave reflectors arranged between the groups of finger pairs.

8. An acoustic wave oscillator comprising an amplifier and an acoustic wave delay line connected to form a feedback loop to the amplifier, the acoustic wave delay line comprising: a substrate able to support acoustic waves, an interdigital comb input transducer for launching acoustic waves in the substrate, an interdigital comb output transducer for detecting and receiving acoustic waves launched by the input transducer, wherein one of the transducers is of greater effective length than the other transducer, and wherein the length of at least the longer transducer is related to the separation of the transducers so as to produce frequency responses which suppress unwanted modes of acoustic frequency oscillation and allow only one mode of oscillation.

* * * * *